United States Patent
Fukuda

(10) Patent No.: US 10,580,811 B2
(45) Date of Patent: Mar. 3, 2020

(54) IMAGE PICKUP ELEMENT PACKAGE HAVING A SUPPORTING RESIN FRAME WITH A THERMALLY CONDUCTIVE PORTION INCLUDING ELECTRONIC COMPONENTS, AND ASSOCIATED IMAGE PICKUP APPARATUS

(71) Applicant: SONY CORPORATION, Tokyo (JP)

(72) Inventor: Keiki Fukuda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/773,617

(22) PCT Filed: Oct. 7, 2016

(86) PCT No.: PCT/JP2016/004520
§ 371 (c)(1),
(2) Date: May 4, 2018

(87) PCT Pub. No.: WO2017/090223
PCT Pub. Date: Jun. 1, 2017

(65) Prior Publication Data
US 2019/0067350 A1 Feb. 28, 2019

(30) Foreign Application Priority Data
Nov. 24, 2015 (JP) .................................. 2015-228587

(51) Int. Cl.
*H01L 27/146* (2006.01)
*H01L 27/14* (2006.01)
(Continued)

(52) U.S. Cl.
CPC ........ *H01L 27/14618* (2013.01); *H01L 27/14* (2013.01); *H01L 27/14627* (2013.01);
(Continued)

(58) Field of Classification Search
CPC ......... H01L 27/14618; H01L 27/14683; H01L 27/14625; H01L 31/024;
(Continued)

(56) References Cited

U.S. PATENT DOCUMENTS 7,511,299 B1 * 3/2009 Alexander ............. H01L 22/32
257/48
8,159,595 B2 * 4/2012 Shiraishi ........... H01L 27/14618
348/340
(Continued)

FOREIGN PATENT DOCUMENTS

CN 1988133 A 6/2007
CN 104576570 A 4/2015
(Continued)

OTHER PUBLICATIONS

International Search Report and Written Opinion of PCT Application No. PCT/JP2016/004520, dated Dec. 6, 2016, 09 pages of ISRWO.

*Primary Examiner* — Younes Boulghassoul
(74) *Attorney, Agent, or Firm* — Chip Law Group

(57) ABSTRACT

An image pickup element package according to an embodiment of the present technology includes a solid-state image pickup element, a circuit board, a translucent substrate, and a support. The solid-state image pickup element includes a light-receiving surface, and a back surface on a side opposite to the light-receiving surface. The circuit board supports the back surface of the solid-state image pickup element. The translucent substrate is opposed to the light-receiving surface. The support includes a resin frame portion and a conductor portion and is disposed between the circuit board and the translucent substrate. The resin frame portion includes a hollow portion that houses the solid-state image pickup element, and a fixation portion that is fixed to a casing portion of an image-pickup device. The conductor (Continued)

portion is integrally provided in the resin frame portion and provides thermal connection between the circuit board and the fixation portion.

5 Claims, 5 Drawing Sheets

(51) Int. Cl.
  *H04N 5/225* (2006.01)
  *H01L 31/024* (2014.01)
(52) U.S. Cl.
  CPC ...... *H01L 27/14683* (2013.01); *H01L 31/024* (2013.01); *H04N 5/2253* (2013.01); *H01L 27/14625* (2013.01); *H04N 5/2252* (2013.01)
(58) Field of Classification Search
  CPC .... H01L 23/367–3677; H01L 23/3736; H04N 5/2253; H04N 5/2252; H04N 5/22521
  See application file for complete search history.

(56) References Cited

U.S. PATENT DOCUMENTS

| | | | |
|---|---|---|---|
| 2005/0174469 A1* | 8/2005 | Cho | H01L 27/14618 348/340 |
| 2007/0166955 A1 | 7/2007 | Noma | |
| 2010/0045832 A1* | 2/2010 | Mochiduki | H01L 27/14618 348/294 |
| 2010/0243872 A1* | 9/2010 | Amano | H01L 27/14618 250/238 |
| 2012/0248294 A1* | 10/2012 | Kohama | H01L 27/14618 250/214 P |
| 2012/0314126 A1* | 12/2012 | Liu | H01L 27/14618 348/374 |
| 2014/0339668 A1* | 11/2014 | Arima | H01L 23/4006 257/443 |
| 2015/0116946 A1* | 4/2015 | Katase | H05K 7/2039 361/713 |
| 2015/0181698 A1* | 6/2015 | Suganuma | H04N 5/2253 250/208.1 |
| 2018/0286902 A1* | 10/2018 | Hokari | H01L 23/562 |

FOREIGN PATENT DOCUMENTS

| | | |
|---|---|---|
| DE | 102014221650 A1 | 4/2015 |
| EP | 1801849 A2 | 6/2007 |
| JP | 2007-173483 A | 7/2007 |
| JP | 2013-222772 A | 10/2013 |
| JP | 2014-170819 A | 9/2014 |
| JP | 2015-084377 A | 4/2015 |
| KR | 10-2007-0067634 A | 6/2007 |
| SG | 133571 A1 | 7/2007 |
| TW | I329931 B | 9/2010 |

\* cited by examiner

IMAGE PICKUP ELEMENT PACKAGE HAVING A SUPPORTING RESIN FRAME WITH A THERMALLY CONDUCTIVE PORTION INCLUDING ELECTRONIC COMPONENTS, AND ASSOCIATED IMAGE PICKUP APPARATUS

CROSS REFERENCE TO RELATED APPLICATIONS

This application is a U.S. National Phase of International Patent Application No. PCT/JP2016/004520 filed on Oct. 7, 2016, which claims priority benefit of Japanese Patent Application No. JP 2015-228587 filed in the Japan Patent Office on Nov. 24, 2015. Each of the above-referenced applications is hereby incorporated herein by reference in its entirety.

TECHNICAL FIELD

The present technology relates to an image pickup element package that houses a solid-state image pickup element such as a CMOS image sensor, an image pickup apparatus including the same, and a manufacturing method for an image pickup element package.

BACKGROUND ART

There are more and more cases where continuous shooting of high-definition images for a long time is performed in an image pickup apparatus such as a video camera and a still camera. Therefore, in some cases, the temperature of an image sensor excessively increases, which causes malfunctions in the apparatus. Thus, the heat dissipation characteristics of the image sensor and a package therefor are important characteristics for the image pickup apparatus.

For example, Patent Literature 1 has disclosed an image pickup element package. The image pickup element package includes a substrate and a resin frame. The substrate fixes a back surface of a light-receiving surface of an image-pickup element. The frame includes screw holes for fixation to a lens holder. The resin frame is bonded to the substrate, surrounding a periphery of the image-pickup element. This image pickup element package is configured to be capable of dissipating inside heat to the lens holder via a metal plate provided in the frame.

CITATION LIST

Patent Literature

Patent Literature 1: Japanese Patent Application Laid-open No. 2013-222772

DISCLOSURE OF INVENTION

Technical Problem

However, in the structure of Patent Literature 1, the resin frame is provided between the substrate and the metal plate. Therefore, there is a problem in that heat transfer from the substrate to the metal plate is inhibited and it is difficult to efficiently discharge heat inside the package.

In view of the above-mentioned circumstances, it is an object of the present technology to provide an image pickup element package capable of efficiently discharging heat inside a package, an image pickup apparatus, and a manufacturing method for an image pickup element package.

Solution to Problem

An image pickup element package according to an embodiment of the present technology includes a solid-state image pickup element, a circuit board, a translucent substrate, and a support.

The solid-state image pickup element includes a light-receiving surface, and a back surface on a side opposite to the light-receiving surface.

The circuit board supports the back surface of the solid-state image pickup element.

The translucent substrate is opposed to the light-receiving surface.

The support includes a resin frame portion and a conductor portion, and is disposed between the circuit board and the translucent substrate. The resin frame portion includes a hollow portion that houses the solid-state image pickup element, and a fixation portion that is fixed to a casing portion of an image-pickup device. The conductor portion is integrally provided in the resin frame portion and provides thermal connection between the circuit board and the fixation portion.

The image pickup element package includes the conductor portion that provides thermal connection between the circuit board and the fixation portion. Therefore, it is possible to efficiently discharge heat inside the package from the circuit board to the fixation portion via this conductor portion.

The resin frame portion may include a first resin layer that is provided in the circuit board, and a second resin layer that provides connection between the first resin layer and the translucent substrate. The conductor portion may include a first conductor component and a second conductor component. The first conductor component includes a first end portion connected to the circuit board, and a second end portion on a side opposite thereto, the first conductor component being disposed inside the first resin layer. The second conductor component provides connection between the second end portion and the fixation portion and is fixed to the second resin layer.

The first conductor component may include a plurality of electronic components installed in the circuit board. Alternatively, the first conductor component may include a plurality of metal blocks installed in the circuit board.

The first resin layer may include a first opening portion that constitutes the hollow portion, and the second resin layer may include a second opening portion that constitutes the hollow portion and has an opening area smaller than that of the first opening portion. With this, it is possible to reduce the area of the translucent substrate.

The circuit board may include a heat dissipation layer provided in a region opposed to the back surface of the solid-state image pickup element. With this, it is possible to improve the heat dissipation characteristic of the solid-state image pickup element.

An image pickup apparatus according to an embodiment of the present technology includes a casing portion, a solid-state image pickup element, a circuit board, a translucent substrate, a support, and a lens.

The solid-state image pickup element includes a light-receiving surface, and a back surface on a side opposite to the light-receiving surface.

The circuit board supports the back surface of the solid-state image pickup element.

The translucent substrate is opposed to the light-receiving surface.

The support includes a resin frame portion and a conductor portion and is disposed between the circuit board and the translucent substrate. The resin frame portion includes a hollow portion that houses the solid-state image pickup element, and a fixation portion that is fixed to the casing portion. The conductor portion is integrally provided in the resin frame portion and provides thermal connection between the circuit board and the fixation portion.

The lens is housed in the casing portion and opposed to the light-receiving surface via the translucent substrate.

The image pickup apparatus includes the conductor portion that provides thermal connection between the circuit board and the fixation portion. Therefore, it is possible to efficiently discharge heat inside the package from the circuit board to the casing portion via this conductor portion.

A manufacturing method for an image pickup element package according to an embodiment of the present technology includes installing a plurality of first conductor components around an element-mounting region on a circuit board.

A first resin layer is formed in a frame shape surrounding the element-mounting region, the first resin layer covering a periphery of the first conductor component.

A solid-state image pickup element is mounted in the element-mounting region.

A second resin layer including a second conductor component that is connected to the first conductor component is bonded on the first resin layer.

A translucent substrate that is opposed to a light-receiving surface of the solid-state image pickup element is bonded on the second resin layer.

Advantageous Effects of Invention

As described above, in accordance with the present technology, it is possible to efficiently discharge heat inside a package.

It should be noted that the effects described here are not necessarily limitative and any effect described in the present disclosure may be provided.

MODE(S) FOR CARRYING OUT THE INVENTION

Hereinafter, an embodiment according to the present technology will be described with reference to the drawings.

Figure 1:
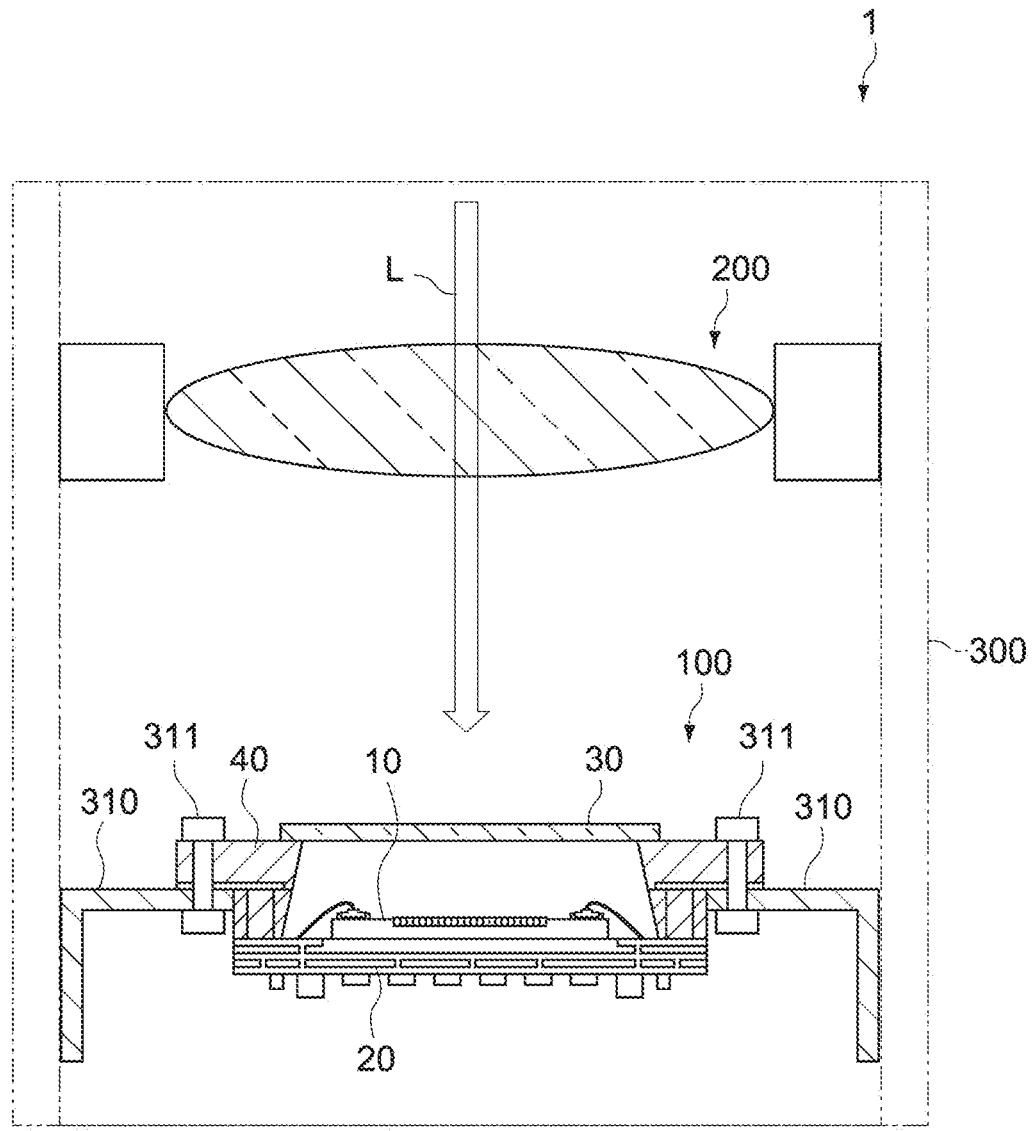
FIG. 1. A main-part schematic cross-sectional view of an image pickup apparatus according to an embodiment of the present technology.

FIG. 1 is a main-part schematic cross-sectional view of an image pickup apparatus according to an embodiment of the present technology.

[Image Pickup Apparatus]

An image pickup apparatus 1 of this embodiment includes an image pickup element package 100, a lens 200, and a casing portion 300.

The image pickup element package 100 and the lens 200 are housed in the casing portion 300. The casing portion 300 is, for example, configured as a part of a barrel portion of a video camera, a still camera, or the like or a part of a casing portion of a portable information terminal such as a mobile phone and a smartphone. The casing portion 300 that supports the image pickup element package 100 is made of, for example, a material excellent in thermal conductivity, such as metal. Note that the shape, the structure, and the like of the casing portion 300 are not particularly limited as long as it can fix the image pickup element package 100 and the lens 200 such that respective optical axes thereof are aligned in an identical straight line as shown in FIG. 1.

The lens 200 is not limited to the single lens. The lens 200 may be a lens unit including a plurality of lenses. Further, the lens 200 may be configured to be movable in an optical-axis direction with respect to the casing portion 300.

[Image Pickup Element Package]

The image pickup element package 100 includes a solid-state image pickup element 10, a circuit board 20, a translucent substrate 30, and a support 40. The image pickup element package 100 is fixed to the casing portion 300 via fixation metal fittings 310 fixed to the support 40. The image pickup element package 100 is disposed at a position at which the lens 200 is opposed to the light-receiving surface 10A (see FIG. 2) of the solid-state image pickup element 10 via the translucent substrate 30.

Figure 2:
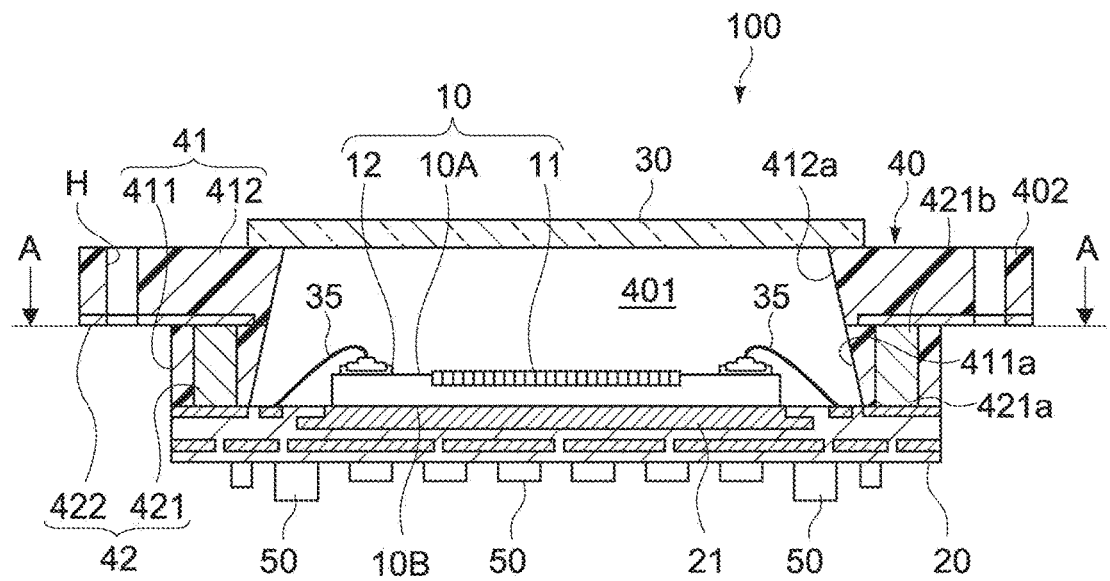
FIG. 2. An enlarged view of an image pickup element package in the image pickup apparatus.
Figure 3:
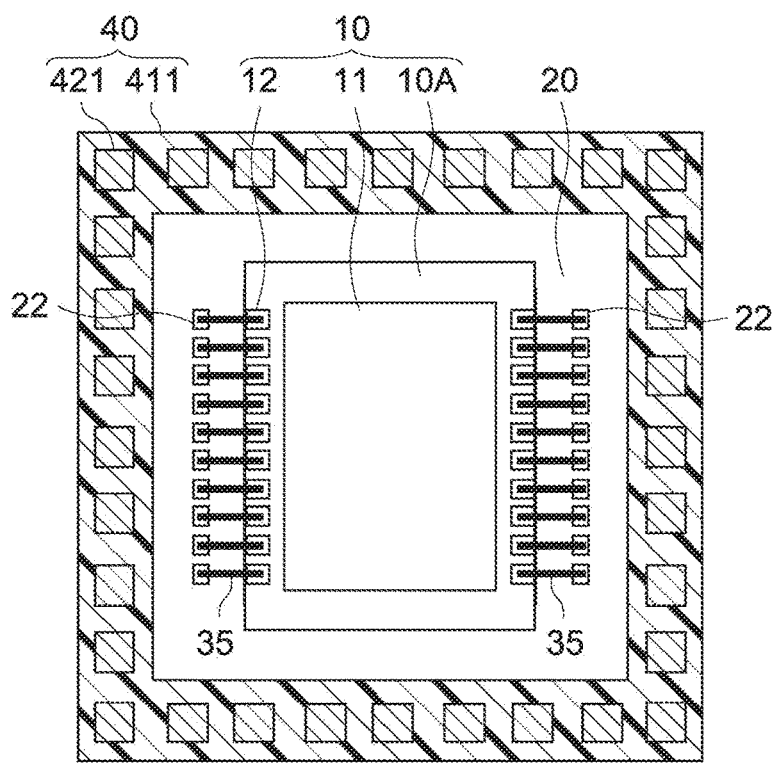
FIG. 3. A cross-sectional view taken along the line A-A of FIG. 2.

FIG. 2 is an enlarged view of the image pickup element package 100. FIG. 3 is a cross-sectional view taken along the line A-A of FIG. 2. Note that FIG. 3 is for the sake of description, and the size and dimension ratio of each part are not necessarily identical to those of FIG. 2.

As shown in FIGS. 2 and 3, the image pickup element package 100 has a package structure for housing the solid-state image pickup element 10 therein. At a peripheral portion thereof, there are a plurality of fixation portions 402. The plurality of fixation portions 402 are coupled to the fixation metal fittings 310 via fasteners 311 such as bolts.

The solid-state image pickup element 10 includes an image sensor including a light-receiving surface 10A. Typically, the solid-state image pickup element 10 includes a CMOS (Complementary Metal Oxide Semiconductor), a CCD (Charge Coupled Device) sensor, and the like. The light-receiving surface 10A includes a light-receiving portion 11 and a plurality of terminal portions 12 arrayed around it. A back surface 10B of the solid-state image pickup element 10 on a side opposite to the light-receiving portion 10A is supported by the circuit board 20. The light-receiving surface 10A and the light-receiving portion 11 are formed in a rectangular shape as shown in FIG. 3. The terminal portions 12 are arrayed at predetermined intervals along each of longer sides of the light-receiving surface 10A.

The solid-state image pickup element 10 receives an object luminous flux L (see FIG. 1) passing through the lens 200, at the light-receiving portion 11. The solid-state image pickup element 10 generates charges depending on the amount of received light by photoelectric conversion. The solid-state image pickup element 10 outputs them as electrical signals through the terminal portions 12.

The circuit board 20 includes a multi-layer wiring board, and typically includes an organic substrate such as a glass-epoxy substrate. The circuit board 20 is configured as an interposer substrate that is interposed between a control board (mother board) (not shown) and the solid-state image pickup element 10 for providing electrical connection therebetween. In the electrical connection between the circuit board 20 and the control board includes, these are connected via a flexible wiring board and the like (not shown), for example.

The solid-state image pickup element 10 is mounted on a surface (upper surface in FIG. 2) of the circuit board 20 in accordance with a face-up method, i.e., in such a manner that the light-receiving surface 10A thereof is upwardly oriented. On the surface of the circuit board 20, there are arrayed a plurality of terminal portions 22 electrically connected to the terminal portions 12 of the solid-state image pickup element 10 via bonding wires 35 as shown in FIG. 3.

The circuit board 20 includes a heat dissipation layer 21. The heat dissipation layer 21 is provided in a region opposed to the back surface 10B of the solid-state image pickup element 10. The heat dissipation layer 21 typically includes a solid film of a conductor layer (copper foil, etc.) formed in the surface of the circuit board. The heat dissipation layer 21 is connected to first conductor components 421, which will be described later, via an inside of the circuit board 20, for example. With this, it is possible to improve the heat dissipation characteristic of the solid-state image pickup element 10. Note that elements and components other than the solid-state image pickup element 10 may be installed in the surface of the circuit board 20.

A plurality of electronic components 50 are mounted on a back surface (lower surface in FIG. 2) of the circuit board 20. The plurality of electronic components 50 constitute peripheral circuits of the solid-state image pickup element 10. These electronic components 50 may include an integrated circuit such as an IC in addition to passive elements such as resistors and capacitors.

The translucent substrate 30 is formed of a plate material. The plate material is made of glass, transparent plastic, and the like. The plate material is disposed, opposed to the light-receiving surface 10A of the solid-state image pickup element 10. The translucent substrate 30 is fixed to the circuit board 20 via the support 40 and closes a hollow portion 401 in which the solid-state image pickup element 10 is housed.

The support 40 includes a resin frame portion 41 and a conductor portion 42. The support 40 is disposed between the circuit board 20 and the translucent base material 30. The resin frame portion 41 includes the hollow portion 401 for housing the solid-state image pickup element 10 and the fixation portions 402 fixed to the casing portion 300. The conductor portion 42 is integrally provided in the resin frame portion 41 and provides thermal connection between the circuit board 20 and the fixation portions 402.

The resin frame portion 41 includes a first resin layer 411 and a second resin layer 412. The first resin layer 411 is provided in the circuit board 20. The second resin layer 412 provides connection between the first resin layer 411 and the translucent substrate 30. The first resin layer 411 and the second resin layer 412 are, for example, formed of a cured matter of a thermosetting resin such as a mat black epoxy resin. The resin frame portion 41 is configured as a sealing layer that shields the solid-state image pickup element 10 from the outside air on the circuit board 20.

As shown in FIG. 3, the first resin layer 411 is formed in a rectangular ring shape on the surface of the circuit board 20, surrounding the solid-state image pickup element 10. The first resin layer 411 includes a first opening portion 411a for exposing the light-receiving portion 11 of the solid-state image pickup element 10 to the translucent substrate 30.

The first opening portion 411a is a rectangular shape and a peripheral portion thereof is formed in a reverse-taper shape having an opening area that becomes larger in a direction toward the circuit board 20 from the translucent substrate 30, though not limited thereto. It may be formed as a perpendicular surface orthogonal to the surface of the circuit board 20.

Alternatively, it may be formed in a taper shape having an opening area that becomes smaller toward the circuit board 20 from the translucent substrate 30. The first resin layer 411 has a height dimension larger in the thickness of the solid-state image pickup element 10 as shown in FIG. 2, though not limited thereto as a matter of course. It may be a height equal to or smaller than the thickness of the solid-state image pickup element 10.

The second resin layer 412 is formed of the rectangular annular frame body integrally bonded to the first resin layer 411. The second resin layer 412 includes a second opening portion 412a for exposing the light-receiving portion 11 of the solid-state image pickup element 10 to the translucent substrate 30. The second opening portion 412a is disposed concentrically with the first opening portion 411a, and forms the hollow portion 401 having a polygon-frustum shape together with the first opening portion 411a.

The second opening portion 412a has a rectangular shape. A peripheral portion thereof is formed in a reverse-taper shape having an opening area that becomes smaller in a direction toward the translucent substrate 30 from the first resin layer 411 such that it is continuous with the peripheral portion of the first opening portion 411a. With this, it is possible to reduce the area of the translucent substrate 30. Further, it becomes possible to reduce unnecessary incident light such as stray light to the light-receiving surface 10A by reducing the area of the translucent substrate 30.

The conductor portion 42 includes the first conductor components 421 and a second conductor component 422.

Each of the first conductor components 421 includes a first end portion 421a connected to the circuit board 20 and a second end portion 421b on a side opposite thereto, and is disposed inside the first resin layer 411. In this embodiment, the first conductor components 421 are constituted by a plurality of electronic components or metal blocks arrayed in a rectangular ring form, surrounding the solid-state image pickup element 10 as shown in FIG. 3.

For example, low-resistance elements such as zero-ohm resistors are favorable as electronic components that constitute the first conductor components 421. Further, a metal material low in resistance and excellent in thermal conductivity, such as copper and aluminum, is favorable for the above-mentioned metal blocks. By using those electronic components or metal blocks as the first conductor components 421, heat of the circuit board 20 can be efficiently transferred to the second conductor component 422.

The first end portions 421a of the first conductor components 421 are, for example, bonded to a metal pattern (land) provided on the circuit board 20 via solder and the like. With this, the thermal resistance between the circuit board 20 and the first conductor components 421 can be reduced. The arrangement intervals of the plurality of electronic components or metal blocks or the number of electronic components or metal blocks that constitute the first conductor components 421 are not particularly limited. An appropriate value is set such that a required heat dissipation characteristic of the circuit board 20 can be obtained. Further, the shape of the first conductor components 421 is also not particularly limited. Not only the prism shape shown in the figure but also an arbitrary shape such as a circular column shape can be applied.

Note that the plurality of electronic components described above may include an electronic component such as a heating element. With this, it is possible to also improve the heat dissipation characteristic of that electronic component. Further, some of the plurality of electronic components described above may include circuit element and component that do not function as the first conductor components 421. By utilizing also the region in which the first resin layer 411 is formed as the mounting region, it is possible to increase the component mounting density of the circuit board 20.

Note that, further, it is not limited to the case where the first conductor components 421 are constituted by the plurality of electronic components, the metal blocks, and the like, and the first conductor components 421 may be constituted by a single rectangle annular metal block or the like. With this, it is possible to improve the heat dissipation characteristic of the circuit board 20 and the workability for mounting on the circuit board 20.

The second conductor component 422 is fixed to the second resin layer 422, and provides connection between the second end portions 421*b* of the first conductor components 421 and the fixation portions 402 of the support 40. In this embodiment, the second conductor component 422 is constituted by a metal plate such as copper and aluminum provided on the lower surface of the second resin layer 412. With this, it becomes possible to ensure stable bonding to the first conductor components 421 and improve the mechanical strength of the fixation portions 402.

Note that the second conductor component 422 is not limited to the example in which it is constituted by the metal plate, and it may be constituted by a net-like mesh material, a wire rod, or the like. Further, the second conductor component 422 is not limited to the example in which it is provided on the lower surface of the second resin layer 412, and it may be embedded in the second resin layer 412.

The fixation portions 402 are provided at predetermined sites in a periphery of the second resin layer 412, and includes insertion holes H in which the fasteners 311 are inserted. The fixation portions 402 may be constituted by a flange portion formed at a peripheral portion of the second resin layer 412 or a plurality of blade portions outwardly protruding from the peripheral portion of the second resin layer 412.

[Manufacturing Method for Image Pickup Element Package]

Next, a manufacturing method for the image pickup element package 100 will be described. FIGS. 4A, 4B, 4C, 5A, 5B, 6A, 6B, and 6C are schematic cross-sectional views for main steps for explaining the manufacturing method for the image pickup element package 100.

Figure 4A:
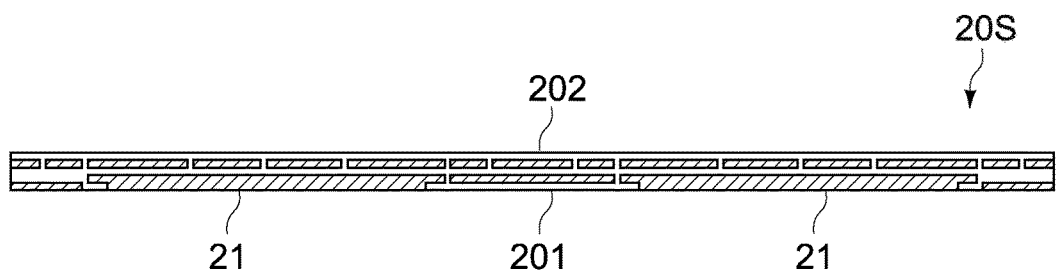
FIGS. 4A, 4B, and 4C A schematic cross-sectional view for main steps for explaining a manufacturing method for the image pickup element package.
Figure 4B:
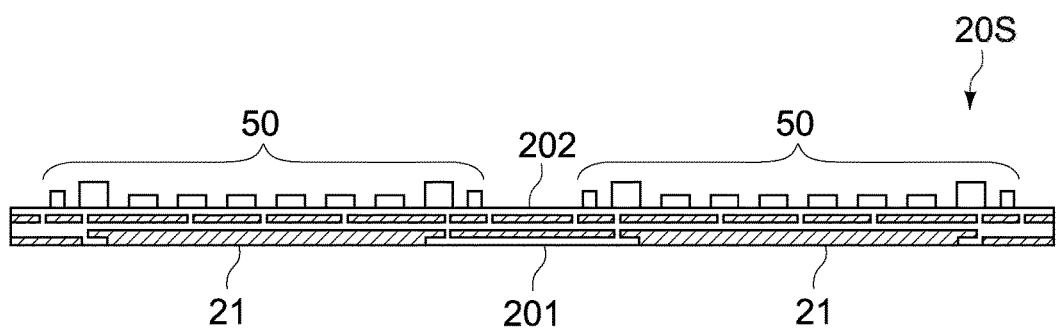

As shown in FIG. 4A, a collective substrate 20S including a collection of the circuit boards 20 is prepared. Then, the plurality of electronic components 50 that constitute the peripheral circuits are mounted by a reflow soldering method or the like with a back surface 202 of the collective substrate 20S being upwardly oriented as shown in FIG. 4B.

Figure 4C:
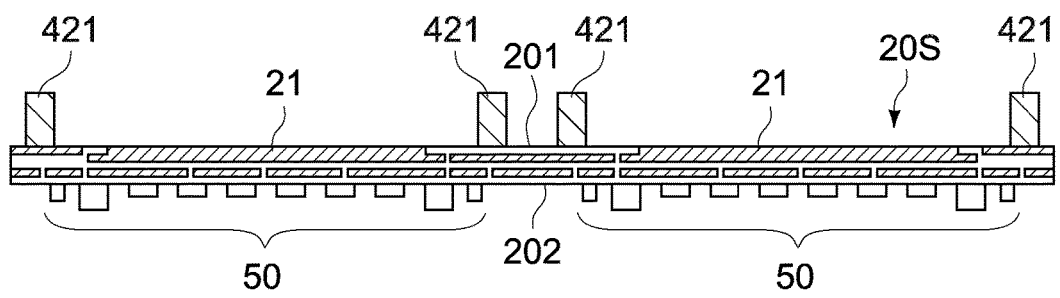

Subsequently, as shown in FIG. 4C, the collective substrate 20S is inverted, and the plurality of electronic components or metal blocks that constitute the first conductor components 421 are installed around a solid-state image pickup element 10-mounting region (e.g., heat dissipation layer 21) of a surface 201. Existing mounter equipment, reflow equipment, and the like are used for mounting the first conductor components 421 on the collective substrate 20S.

Figure 5A:
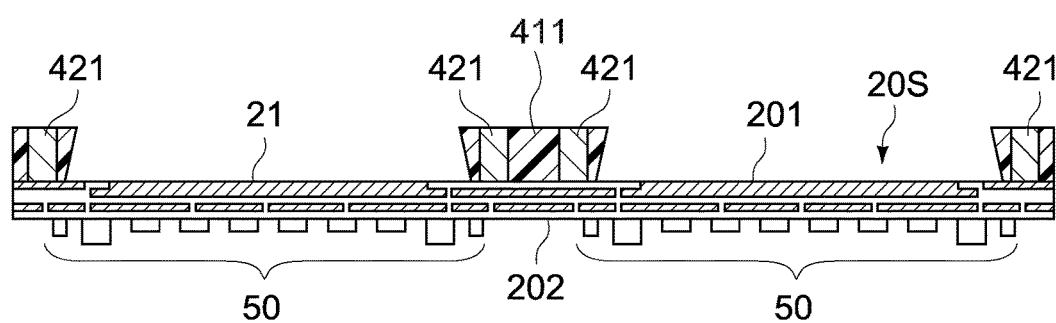
FIGS. 5A and 5B A schematic cross-sectional view for main steps for explaining the manufacturing method for the image pickup element package.

Subsequently, as shown in FIG. 5A, the first resin layer 411 is formed in a frame shape on the surface 201 of the circuit board 20 so as to cover a periphery of the first conductor components 421. The first resin layer 411 formed having a height equivalent to the first conductor components 421, for example, such that top portions (second end portions 421*b*) of the first conductor components 421 are exposed from an upper surface of the first resin layer 411. A formation method for the first resin layer 411 is not particularly limited, and a transfer molding method is typically used therefor. With this, adherence of the first resin layer 411 to the circuit board 20 is ensured.

Further, a space between a plurality of first conductor components 421 adjacent to each other is filled with the first resin layer 411. With this, the first conductor components 421 are embedded in the first resin layer 411. Note that also a space between the first conductor components 421 positioned at a boundary portion of a plurality of circuit boards 20 adjacent to each other is filled with the first resin layer 421.

Figure 5B:
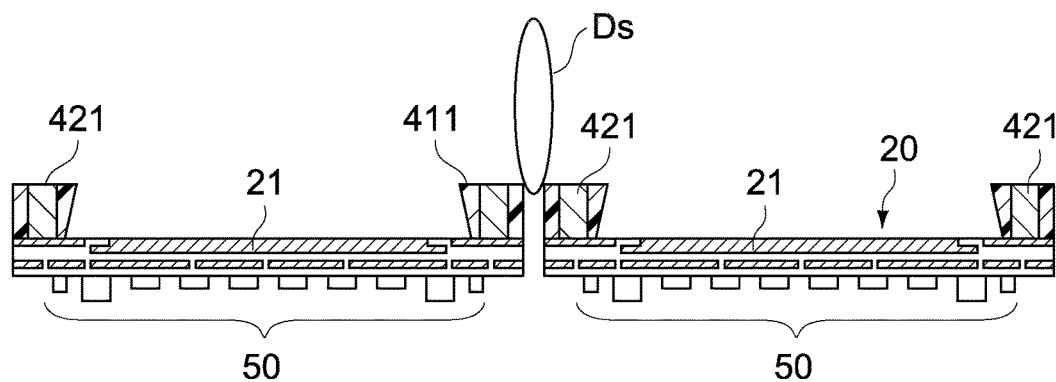

Next, the collective substrate 20S is separated into the individual circuit boards 20. In this step, as shown in FIG. 5B, the first resin layer 411 positioned at the boundary portion between the circuit boards 20 is divided by the use of a machining tool such as a dicing blade Ds. A machining method is not limited to the above example, and another machining method such as laser machining may be employed therefor, for example.

Figure 6A:
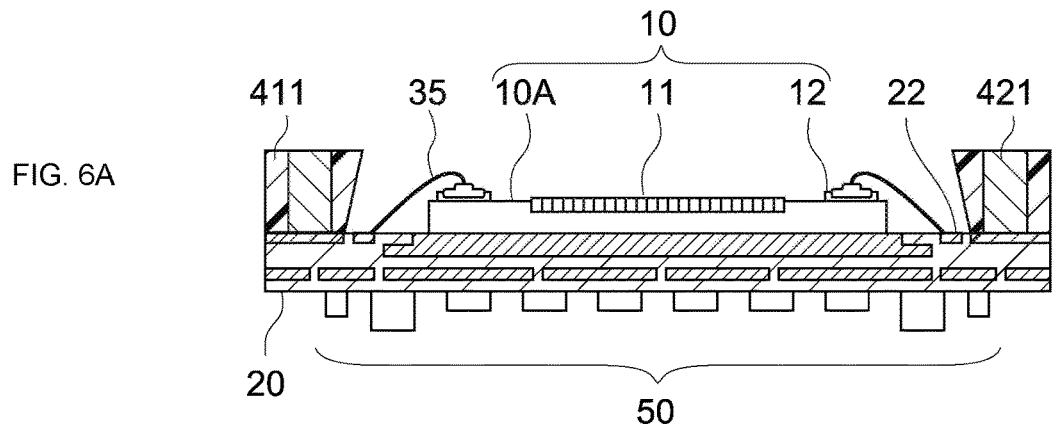
FIGS. 6A, 6B, and 6C A schematic cross-sectional view for main steps for explaining the manufacturing method for the image pickup element package.

Subsequently, as shown in FIG. 6A, the solid-state image pickup element 10 is mounted on the surface of the circuit board 20. For mounting the solid-state image pickup element 10, a back surface of the solid-state image pickup element 10 is bonded to the heat dissipation layer 21 on the circuit board 20 via a non-electrically conductive adhesive, for example (die bonding). After that, the terminal portions 12 of the solid-state image pickup element 10 and the terminal portions 22 of the circuit board 20 are electrically connected via the bonding wires 35 (wire bonding).

Figure 6B:
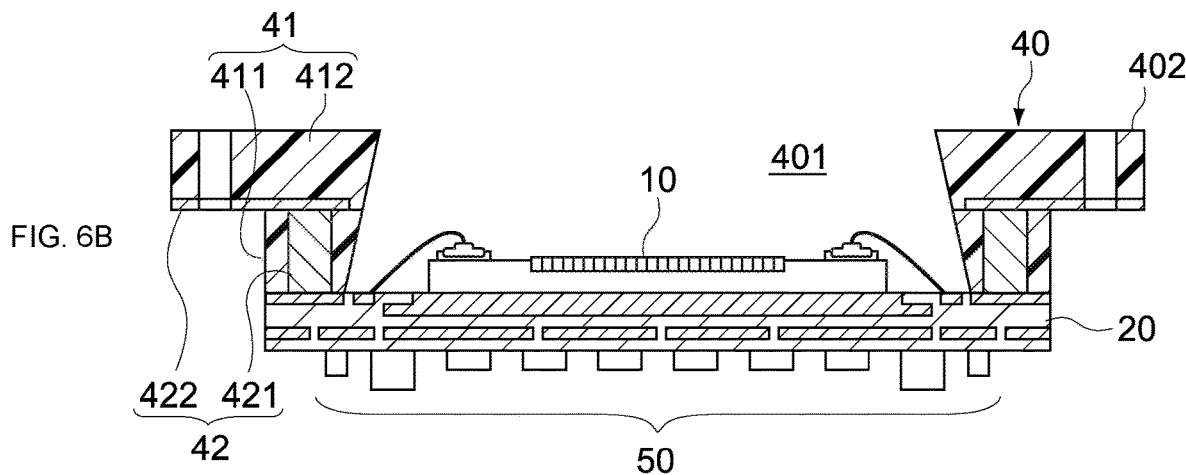

Subsequently, as shown in FIG. 6B, the second resin layer 412 including the second conductor component 422 that is connected to the first conductor components 421 is bonded on the first resin layer 411. With this, the support 40 including the resin frame portion 41 including the hollow portion 401 that houses the solid-state image pickup element 10 and the conductor portion 42 that provides thermal connection between the circuit board 20 and the fixation portions 402 is fabricated.

An adhesive and the like are used for bonding the first resin layer 411 and the second resin layer 412. At this time, an adhesive may be provided between the first conductor components 421 and the second conductor component 422. More favorably, an adhesive excellent in thermal conductivity is used.

Figure 6C:
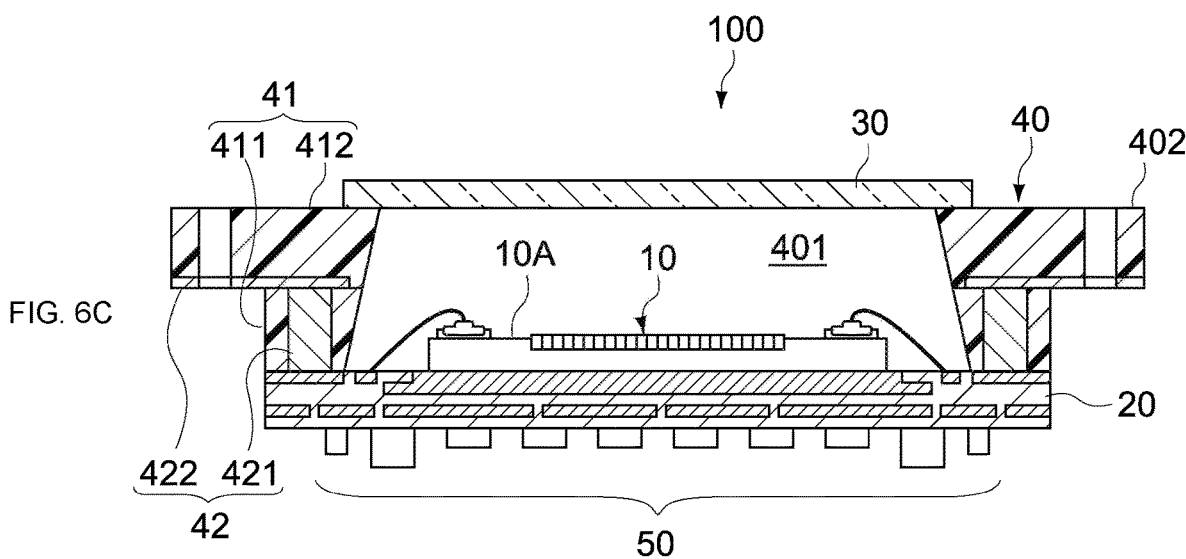

Subsequently, as shown in FIG. 6C, the translucent substrate 30 that is opposed to the light-receiving surface 10A of the solid-state image pickup element 10 is bonded on the support 40 (second resin layer 412), and the hollow portion 401 is hermetically sealed. In the above-mentioned manner, the image pickup element package 100 is fabricated.

[Actions]

In general, a ceramic substrate is often used as an interposer substrate installing an image sensor for ensuring rigidity and a heat dissipation characteristic. There are more and more cases of using an organic substrate for the reason of reducing the costs or the like. Further, for the purposes of improving the circuit characteristics and reducing the size of the unit including the peripheral circuits, the demand for mounting not only an image sensor chip but also peripheral circuit components such as a bypass capacitor on the same substrate is becoming stronger.

However, the thermal conductivity of the organic substrate is, for example, about 1 [W/m*K], and smaller than the thermal conductivity (e.g., about 15 [W/m*K]) of the ceramic substrate. Therefore, the performance for causing heat generated from the driving sensor chip to dissipate outside the package is inferior. In particular, in view of the purpose of utilizing the space or reducing the size by mounting the peripheral circuit components on the both surfaces of the substrate, an area for bonding the heat sink and the like on the substrate surface on the side opposite to the sensor cannot be ensured. Therefore, it is necessary to provide a structure for dissipating heat to a set casing and the like in a horizontal direction (direction of a package side surface).

In contrast, in the image pickup element package 100 of this embodiment, the support 40 includes the conductor portion 42 that provides thermal connection between the circuit board 20 and the fixation portions 402. Therefore, it is possible to efficiently discharge heat inside the package from the circuit board 20 to the fixation portions 402 via this conductor portion 42, and then to the casing portion 300 via the fixation metal fittings 310 coupled to the fixation portions 402. Therefore, also in a case where the organic substrate is used as the circuit board 20, it is possible to efficiently discharge heat generated in the solid-state image pickup element 10 outside the package. With this, for example, it is possible to suppress excessive heat generation of the solid-state image pickup element 10 in long-time shooting, continuous shooting of high-definition images, or the like, and it is possible to prevent malfunctions of the image-pickup device 1 from occurring.

In addition, in accordance with this embodiment, the circuit board 20 is provided with the heat dissipation layer 21 for dissipating heat of the back surface 10B of the solid-state image pickup element 10. Therefore, it is possible to maintain a favorable heat dissipation characteristic of the package and to achieve efficient use of the space of the circuit board 20 or downsizing.

In addition, the first conductor components 421 that constitute the conductor portion 42 are disposed inside the first resin layer 411 that constitutes the support 40. Therefore, a space for additionally disposing components for dissipating heat on the circuit board 20 becomes unnecessary. Further, peripheral elements (components) such as a bypass capacitor on the circuit board 20 can be embedded together in the first resin layer 411. As described above, in accordance with this embodiment, it is possible to easily achieve efficient use of the component mounting space of the circuit board 20, an increase in the component mounting density, downsizing of the circuit board 20, and the like.

Although the embodiment of the present technology has been described above, the present technology is not limited only to the above-mentioned embodiment and can be variously modified as a matter of course.

For example, in the above-mentioned embodiment, the first resin layer 411 is molded on the circuit board 20 in which the first conductor components 421 are installed. After that, the second resin layer including the second conductor component 422 is stacked on the first resin layer 411. Instead of this, a frame-like member in which the first resin layer 411 and the first conductor components 421 are integrally formed may be directly installed on the circuit board. Alternatively, a frame-like molding in which first and second resin layers and first and second conductor components are integrally formed may be directly installed on the circuit board.

Further, in the above-mentioned embodiment, the wire bonding method is employed for electrical connection of the solid-state image pickup element 10 and the circuit board 20, though not limited thereto. For example, in a case where a terminal portion 11 of the solid-state image pickup element 10 is disposed on the back surface 10B on a side opposite to the light-receiving surface 10A, a flip-chip may be connected to the surface of the circuit board 20 via bumps provided in these terminal portions. In this case, it becomes possible to electrically and mechanically connect the solid-state image pickup element 10 to the circuit board 20.

It should be noted that the present technology may also take the following configurations.

(1) An image pickup element package, including:
 a solid-state image pickup element including
  a light-receiving surface, and
  a back surface on a side opposite to the light-receiving surface;
 a circuit board that supports the back surface of the solid-state image pickup element;
 a translucent substrate that is opposed to the light-receiving surface; and
 a support including
  a resin frame portion including
   a hollow portion that houses the solid-state image pickup element, and
   a fixation portion that is fixed to a casing portion of an image-pickup device, and
  a conductor portion that is integrally provided in the resin frame portion and provides thermal connection between the circuit board and the fixation portion,
  the support being disposed between the circuit board and the translucent substrate.

(2) The image pickup element package according to (1), in which
 the resin frame portion includes
  a first resin layer that is provided in the circuit board, and
  a second resin layer that provides connection between the first resin layer and the translucent substrate, and
 the conductor portion includes
  a first conductor component including
   a first end portion connected to the circuit board, and
   a second end portion on a side opposite thereto, the first conductor component being disposed inside the first resin layer, and
  a second conductor component that provides connection between the second end portion and the fixation portion and is fixed to the second resin layer.

(3) The image pickup element package according to (2), in which
 the first conductor component includes
 a plurality of electronic components installed in the circuit board.

(4) The image pickup element package according to (2), in which
 the first conductor component includes a plurality of metal blocks installed in the circuit board.

(5) The image pickup element package according to any one of (2) to (4), in which
 the first resin layer includes a first opening portion that constitutes the hollow portion, and the second resin layer includes a second opening portion that constitutes the hollow portion and has an opening area smaller than that of the first opening portion.

(6) The image pickup element package according to any one of (1) to (5), in which
the circuit board includes a heat dissipation layer provided in a region opposed to the back surface of the solid-state image pickup element.

(7) An image pickup apparatus, including:
a casing portion;
a solid-state image pickup element including
a light-receiving surface, and
a back surface on a side opposite to the light-receiving surface;
a circuit board that supports the back surface of the solid-state image pickup element;
a translucent substrate that is opposed to the light-receiving surface;
a support including
a resin frame portion including
a hollow portion that houses the solid-state image pickup element, and
a fixation portion that is fixed to the casing portion, and
a conductor portion that is integrally provided in the resin frame portion and provides thermal connection between the circuit board and the fixation portion, the support being disposed between the circuit board and the translucent substrate; and
a lens that is housed in the casing portion and opposed to the light-receiving surface via the translucent substrate.

(8) A manufacturing method for an image pickup element package, including:
installing a plurality of first conductor components around an element-mounting region on a circuit board;
forming a first resin layer in a frame shape surrounding the element-mounting region, the first resin layer covering a periphery of the first conductor component;
mounting a solid-state image pickup element in the element-mounting region;
bonding, on the first resin layer, a second resin layer including a second conductor component that is connected to the first conductor component; and
bonding, on the second resin layer, a translucent substrate that is opposed to a light-receiving surface of the solid-state image pickup element.

REFERENCE SIGNS LIST 1 image pickup apparatus
10 solid-state image pickup element
10A light-receiving surface
11 light-receiving portion
20 circuit board
21 heat dissipation layer
30 translucent substrate
35 bonding wire
40 support
41 resin frame portion
42 conductor portion
100 image pickup element package
200 lens
300 casing portion
401 hollow portion
402 fixation portion
411 first resin layer
412 second resin layer
421 first conductor component
422 second conductor component

The invention claimed is:

1. An image pickup element package, comprising:
a solid-state image pickup element including:
a light-receiving surface, and
a back surface on a side opposite to the light-receiving surface;
a circuit board that supports the back surface of the solid-state image pickup element;
a translucent substrate that is opposed to the light-receiving surface; and
a support including:
a resin frame portion including:
a hollow portion that houses the solid-state image pickup element,
a fixation portion that is fixed to a casing portion of an image-pickup device,
a first resin layer on the circuit board,
a second resin layer that provides connection between the first resin layer and the translucent substrate, wherein
the first resin layer includes a first opening portion that constitutes the hollow portion,
the second resin layer includes a second opening portion that constitutes the hollow portion, and
an opening area of the second opening portion is smaller than
an opening area of the first opening portion; and
a conductor portion in the resin frame portion, wherein
the conductor portion provides a thermal connection between the circuit board and the fixation portion,
the support is between the circuit board and the translucent substrate,
the conductor portion includes a plurality of first conductor components, and
each of the plurality of first conductor components comprises an electronic component.

2. The image pickup element package according to claim 1, wherein
the conductor portion further includes a second conductor component different from the plurality of first conductor components,
a first conductor component of the plurality of first conductor components includes
a first end portion connected to the circuit board, and
a second end portion on a side opposite to the first end portion, wherein
the first conductor component is inside the first resin layer,
the second conductor component provides connection between the second end portion and the fixation portion, and
the second conductor component is fixed to the second resin layer.

3. The image pickup element package according to claim 1, wherein the circuit board includes a heat dissipation layer in a region opposite to the back surface of the solid-state image pickup element.

4. The image pickup element package according to claim 1, wherein
the plurality of first conductor components is arrayed in a rectangular ring shape, and
the plurality of first conductor components surrounds the solid-state image pickup element.

5. An image pickup apparatus, comprising:
a casing portion;
a solid-state image pickup element including:
a light-receiving surface, and a back surface on a side opposite to the light-receiving surface;
a circuit board that supports the back surface of the solid-state image pickup element;
a translucent substrate that is opposed to the light-receiving surface;
a support including:
  a resin frame portion including:
    a hollow portion that houses the solid-state image pickup element,
    a fixation portion that is fixed to the casing portion,
    a first resin layer on the circuit board, and
    a second resin layer that provides connection between the first resin layer and the translucent substrate, wherein
      the first resin layer includes a first opening portion that constitutes the hollow portion,
      the second resin layer includes a second opening portion that constitutes the hollow portion, and
      an opening area of the second opening portion is smaller than an opening area of the first opening portion;
  a conductor portion in the resin frame portion, wherein
    the conductor portion provides a thermal connection between the circuit board and the fixation portion,
    the support is between the circuit board and the translucent substrate,
    the conductor portion includes a plurality of conductor components, and
    each of the plurality of conductor components comprises an electronic component; and
a lens housed in the casing portion, wherein the lens is opposed to the light-receiving surface via the translucent substrate.

\* \* \* \* \*